United States Patent [19]

Kersten et al.

[11] Patent Number: 5,390,071
[45] Date of Patent: Feb. 14, 1995

[54] LOW INTERFERENCE CONTROLLED SWITCHING CIRCUIT FOR MULTIPLE LOADS

[75] Inventors: Reinhard Kersten, Aachen, Germany; Martin Sonnek, St. Veit/GL, Austria

[73] Assignee: U.S. Philips Corporation, New York, N.Y.

[21] Appl. No.: 712,229

[22] Filed: Jun. 7, 1991

[30] Foreign Application Priority Data

Jun. 22, 1990 [DE] Germany .............................. 4019928

[51] Int. Cl.⁶ .............................................. H01H 47/00
[52] U.S. Cl. ............................... 361/160; 307/125
[58] Field of Search .............. 361/139, 143, 160, 171; 307/112, 113, 115, 116, 125, 126, 127, 128, 129, 130, 11

[56] References Cited

U.S. PATENT DOCUMENTS 4,480,298 10/1984 Fry .......................................... 307/11
4,906,858 3/1990 Gesin ...................................... 307/11
5,006,724 4/1991 Liu .......................................... 307/11

*Primary Examiner*—Jeffrey A. Gaffin
*Attorney, Agent, or Firm*—Edward Blocker; Bernard Franzblau

[57] ABSTRACT

A power control circuit for at least two ohmic loads includes power semiconductors, switching elements and a control unit for adjusting the power consumption of the loads. In order to comply with international standards to avoid disturbances in mains supply systems when higher loads are switched, a simple and cheap circuit is described which is also suitable for smaller domestic appliances such as light cookers, flat-irons, cooking vessels etc. A control unit controls a switchable power semiconductor unit which can pass current in two directions and connects one or both loads to the single power semiconductor unit via the switching elements in a variety of circuit configurations so as to adjust the power to the loads as required.

19 Claims, 3 Drawing Sheets

LOW INTERFERENCE CONTROLLED SWITCHING CIRCUIT FOR MULTIPLE LOADS

BACKGROUND OF THE INVENTION

This invention relates to a circuit for controlling the power to at least two loads, in a manner so as to minimize interference with the AC power supply. The circuit comprises a power semiconductor unit, switching elements and a control unit for influencing the power consumption of the loads.

The control as well as the regulation of lamps, in particular halogen lamps, whose cold resistance is very low and whose starting and switching currents are very large, gives rise to problems because switching of the lamps gives rise to disturbances on the AC power-supply mains. For power control of such lamps with step control of the power consumption, it is known to switch up and down between the main power modes, for example, parallel operation, series operation and the off-state of two lamps, or to turn on the main power modes only for specific time intervals. When the loads are turned on and off, undesirable switching surges are produced, which cause corresponding mains-voltage fluctuations.

The human eye is particularly sensitive to such mains voltage fluctuations in a frequency range around 10 Hz. Therefore, for the relevant equipment there are regulations prescribing sufficiently small switching transients, such as the IEC standard 555 "Disturbances in supply systems caused by household appliances and similar electrical equipment". This standard in principle defines the harmonic content above 50 Hz and the mains voltage fluctuations below 50 Hz which are permissible to avoid undesirable flicker. In concrete terms this means that power control with short switching times between the main power modes is no longer possible for high loads, for example 1000 W, because the resulting mains voltage fluctuations are then no longer permissible.

Thus, high-power lamps for example cannot automatically be set to full power directly in series or parallel operation. Moreover, in order to reduce the power below the power at the supply voltage and in the case of series operation of the lamps, the supply voltage has to be reduced. It is customary to use switched-mode power supplies for this purpose but these are very complex and expensive. Another possibility is to suppress individual phases of the supply voltage, but this may also lead to substantial mains disturbances.

German Offenlegungsschrift 37 26 535, which corresponds to U.S. Pat. No. 4,871,961 (Oct. 3, 1989) and which is hereby incorporated by reference, describes a method for controlling the power of electrical loads with minimal switching transients, employing an intricate circuit with three triacs or six thyristors. For example in the case of two loads this circuit allows control with different switching modes, i.e. control of the two loads individually, in parallel or in series. This circuit requires a complex and therefore expensive electronic control device for the multitude of power semiconductors used and is susceptible to self-triggering and hence damaging of the power semiconductors.

SUMMARY OF THE INVENTION

Hereinafter, the terms switching states and mains halfcycle patterns are to be understood to mean the same as the term switching modes.

It is an object of the invention to provide a circuit for power control with low mains disturbances which is technically simple and can therefore be used economically in smaller appliances such as light cookers, flat-irons, cooking vessels etc.

According to the invention this object is achieved in that the control unit is adapted to control the power semiconductor unit for two switching directions and to connect one or both loads to the single power semiconductor unit via the switching elements.

In an advantageous embodiment of the invention the power semiconductor unit has a first side connected to ground potential and a second side to the one load and, via the switching elements, to the other load.

In an advantageous embodiment of the invention the power semiconductor unit may comprise one triac or two oppositely poled thyristors and the switching elements may comprise a single relay with a first and a second change-over switch.

In a preferred embodiment of the invention the power semiconductor unit may be connected to a phase terminal of a supply voltage via the one load, a connection line, the second change-over switch and the other load in a first position of the relay. In a second position of the relay the power semiconductor unit may be connected to the phase terminal of the supply voltage via the one load and the first change-over switch and the other load may be arranged in parallel with the power semiconductor unit, the first load and the first change-over switch.

In a further preferred embodiment of the invention a series arrangement comprising the semiconductor unit and a parallel arrangement of the two loads can be realised by means of the switching elements.

In a further preferred embodiment of the invention the switching elements, which comprise a relay, can connect the loads in series and in parallel depending upon the electronic control unit, the power semiconductor unit being arranged between the supply voltage and one of the loads and comprising one triac or two oppositely poled thyristors.

It may be advantageous to arrange a thermistor in the connection between the contacts of the relay switches to limit turn-on transients.

In a preferred embodiment of the invention the control unit may be constructed as a logic device in the form of a microprocessor or the like and may be adapted to set the circuit to various switching states for a quasi pollution-free control of the power consumption. Suitable switching states are:

a) parallel operation of the two loads with the supply voltage,
b) operation of only one load with the supply voltage,
c) operation of the one load with the supply voltage and operation of the other load in the ⅔, ⅓ or 1/5 phase mode,
d) operation as under c) with pulsed phases,
e) series operation of the two loads with the supply voltage,
f) operation of the two loads in series in the ⅔, ⅓ or 1/5 phase mode,
g) operation as under f) with pulsed phases,
h) both loads "off",
i) operation of the one load with the supply voltage and delayed connection of the other load, also in the ⅓ and ⅔ phase mode, and
j) operation of both loads in the ⅔ or ⅓ phase mode.

It is to be noted that the states h) and the relevant phase mode are obtained by a corresponding turn-off of the power semiconductor unit.

Suitably, a highly disturbance-free turn-on can be obtained in that the control unit successively generates the switching states f), e) and a). The last-mentioned switching state may also be replaced by a switching state i) or j), in which one load is connected to the supply voltage and the other load is added with a delay via the power semiconductor unit. This enables a currentless change-over of the relay. This method of switching on is very advantageous in comparison with phase control methods because it is simpler and requires no expensive steps to suppress radio interference.

The circuit in accordance with the invention which comprises only one relay and only one power semiconductor unit is of very simple construction in comparison with the prior-art circuits and enables, for example two high-power lamps to be turned on, up and down substantially disturbance-free. The semiconductor is protected against damage in the case of a failure of the control unit. The multitude of possible switching states and the pulse mode also enable the smallest powers to be controlled. The arrangement of the power semiconductor unit relative to ground enables a simple d.c. coupled control of the power semiconductor unit without a high-voltage transistor and protective diodes. A d.c. coupled zero-point control signal from the control unit enables the power control unit to be started reliably at the earliest possible instant without being influenced by the load.

Moreover, if the power semiconductor unit is arranged in series with only one load a reduction of the heat dissipation is obtained. A further advantage is obtained in that during control of the control unit the loads are arranged in series via the operating contacts of the relay, which is favourable in the event of fault conditions because the maximum attainable power cannot be reached. Moreover, it is to be noted that further switching modes are possible as a result of the possibility of separately switchable change-over switches of the relays.

Further preferred embodiments of the invention are defined in the subsidiary Claims.

BRIEF DESCRIPTION OF THE DRAWING

An embodiment will now be described in more detail with reference to the accompanying drawing. In the drawing.

DESCRIPTION OF THE PREFERRED EMBODIMENTS

Figure 1:
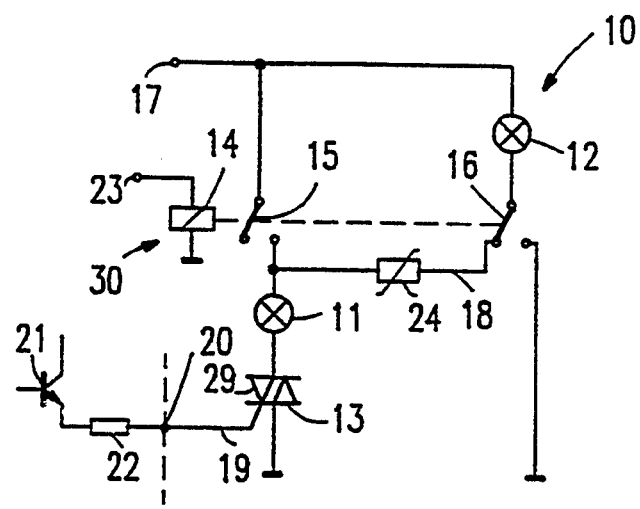
FIG. 1 shows a circuit in accordance with the invention which enables both loads to be connected in series, which enables operation with only one load, and which enables the other load to be added in arbitrary switching modes.

FIG. 1 shows a circuit 10 in accordance with the invention for the power control of two ohmic loads 11, 12 with minimal mains pollution by influencing the power consumption of the loads 11, 12, the loads being preferably high-power lamps. The circuit 10 is driven by a control unit, not shown, and comprises a power semiconductor unit 13 which can pass current in either of two switching directions and switching elements 30. The switching elements preferably comprise a single relay 14 with a first change-over switch 15 and a second change-over switch 16.

In the operating position the first switch 15 connects the phase terminal 17 of a supply voltage initially to the first load 11 which is arranged in series with the power semiconductor unit 13. In the operating position the second switch 16 connects the terminal 17 and the series-connected second load 12 to ground potential. In the rest positions of the switches 15 and 16 the second load 12 is connected to the first load 11 via the corresponding rest contact of the switch 16 and a connecting line 18, which first load is connected at its output side to the power semiconductor unit 13, which is also connected to ground potential.

The control terminal 19 of the power semiconductor unit 13 receives a control signal, which may be generated for example by means of a transistor 21 and a resistor 22, from, for example, a logic device in the form of a microprocessor and via a terminal 20. For this purpose the signal on the base of the transistor 21 may be a squarewave signal. The control unit, which may be a microprocessor but also another logic device, also controls the relay 14 and hence the switching elements 30 via a terminal 23.

It may be very advantageous to arrange a thermistor 24 in the connecting line 18 in order to limit excessive turn-on transients.

The control unit is constructed in such a manner that the circuit 10 can be set to various switching states for the quasi pollution-free control of the power consumption of the loads 11 and 12. Depending on the positions of the switches 15 and 16 and on the control of the power semiconductor unit 13 it is possible to switch to the following advantageous switching states:

a) parallel operation of the two loads 11 and 12, i.e. with triac 13 turned on and relay 30 energized so that contacts 15 and 16 are on the right side, b) operation of only one load 12 with the supply voltage, i.e. with triac 13 turned off and relay 30 energized to supply power to load 12, c) operation of the one load 12 with the supply voltage and operation of the other load 11 in the $\frac{1}{3}$, $\frac{2}{3}$ or 1/5 phase mode, i.e. with the relay 30 energized and triac 13 switched on and off to supply power to load 11 one of three, two of three or one of five cycles of the AC supply voltage at terminal 17, d) operation as under c) with pulsed phases, e) series operation of the two loads 11, 12 with the supply voltage, i.e. triac 13 on and relay 30 de-energized so that loads 11 and 12 are in series between terminal 17 and ground via thermistor 24 and triac 13, f) operation of the two loads 11, 12 in series in the ⅓, ⅔ or 1/5 phase mode, i.e. with relay 30 de-energized and triac 13 switched on and off as in c) above, g) operation as under f) with pulsed phases, h) both loads 11 and 12 "off", i.e. relay 30 de-energized and triac 13 off, i) operation of the one load 12 with the supply voltage and delayed connection of the other load 11, also in the ⅓ and ⅔ phase mode, and j) operation of both loads 11 and 12 in the ⅔ or ⅓ phase mode, i.e. relay 30 de-energized and triac 13 switched on and off to supply power to both loads in one or two of every three cycles of the AC supply voltage.

It is to be noted that the states h) and the relevant phase mode are obtained by suitably turning off the power semiconductor unit 13, as will be explained in the description with reference to FIGS. 6, 7 and 8. Moreover, it is to be noted that the ground potential may be the potential of the neutral conductor of a three-phase supply mains.

Figure 2:
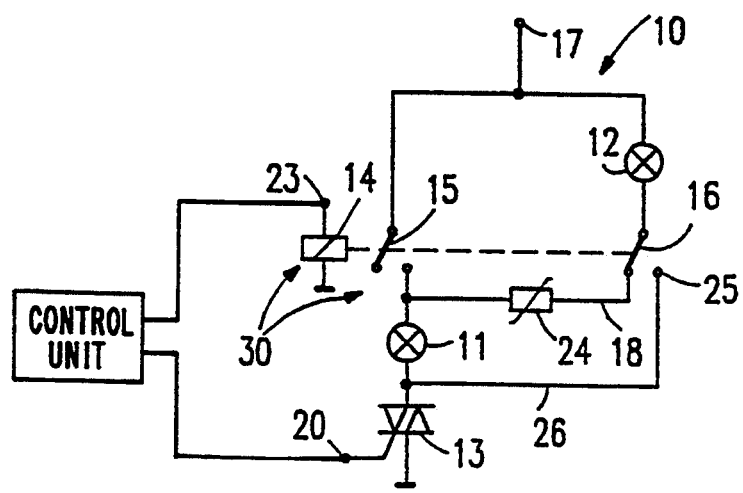
FIG. 2 shows a modification of FIG. 1, which enables series and parallel arrangement of the two loads with arbitrary switching modes.

FIG. 2 shows a modification of the circuit 10 in FIG. 1. The switches 15 and 16 are shown in the rest position. In this modification the operating contact 25, which is connected to the load 12 in the operating position of the switch 16, is not connected to ground potential as in FIG. 1 but is connected to the power semiconductor unit 13 via a connecting line 26 in such a way that in the operating position of the switching element 30, i.e. of the relay 14 having the switching contacts 15 and 16, a series arrangement of the power semiconductor unit 13 and a parallel arrangement of the loads 11 and 12 is obtained.

A special advantage of this modified circuit is that currentless switching of the two loads 11 and 12 is possible during the change-over from the rest position to the operating position of the relay 14 and vice versa. Independent of the state of the switch 30 (contacts 15 and 16), no current can flow through either of the loads 11 or 12 if the semiconductor unit 13 is non-conductive. Therefore, switch 30 can be switched and no load current will flow so long as semiconductor unit 13 is cut-off, thereby providing currentless switching of loads. When it is assumed that in view of the required switching time and contact bounce of the relay 14, the relay 14 can be switched over in the zero crossing of the supply voltage by means of the electronic control unit and the current can be interrupted for one to two halfcycles by means of the power semiconductor unit 13. This modified circuit enables the relay 14 to be switched very economically so that it becomes possible to use simple and consequently cheap relays. However, with this modification a higher dissipation in the power semiconductor unit 13 should be taken into account, because in the case of parallel operation of the loads 11 and 12 the total current flows to ground via the power semiconductor unit 13. The power semiconductor unit 13 in FIGS. 1 and 2 preferably comprises a triac 29.

Figure 3:
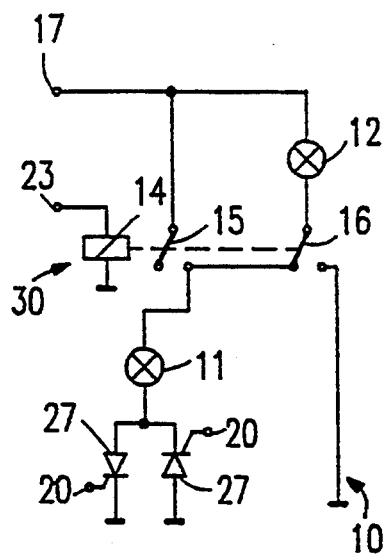
FIG. 3 shows a circuit as shown in FIG. 1, comprising a modified power semiconductor unit.
Figure 4:
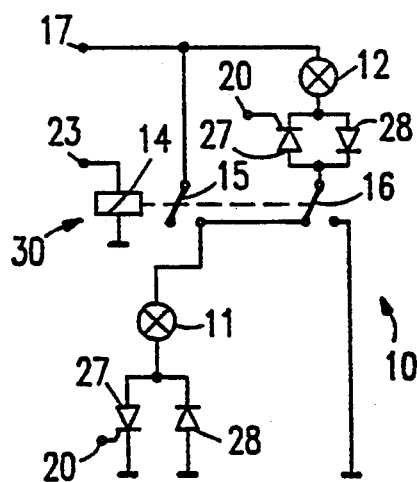
FIG. 4 shows a circuit as shown in FIG. 1 with a divided and modified power semiconductor unit.
Figure 5:
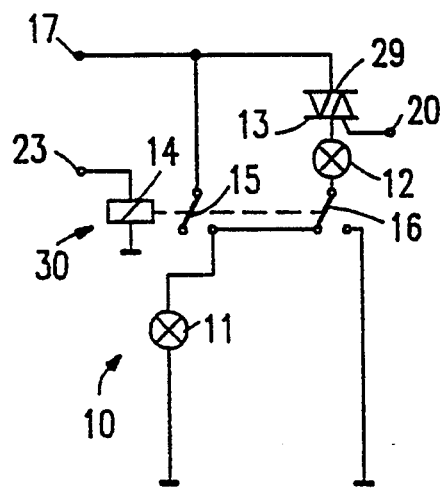
FIG. 5 shows a circuit as shown in FIG. 1 with a power semiconductor unit between the supply voltage and a load.

FIGS. 3, 4 and 5 show different modifications of the circuit 10 shown in FIG. 1 as regards the type and arrangement of the power semiconductor unit 13. FIG. 3 in particular shows the power semiconductor unit 13, which in FIG. 1 comprises a triac 29, constructed by means of two oppositely poled thyristors 27, so that again it is possible to switch the current in two directions.

FIG. 4 illustrates a division of the power semiconductor unit 13 into two parts. Each of the two parts comprises a thyristor 27 and an oppositely poled diode 28. The thyristors are oppositely poled to provide switching in opposite switching directions one part is arranged in series with the one load 11 and the other part is in series with the other load 12. A special advantage of this modification is that it ensures that the semiconductor devices cannot be destroyed by self-triggering.

FIG. 5 shows a further modification of the circuit shown in FIG. 1, the power semiconductor unit 13 again comprising a triac 29, which is now arranged between the terminal 17 and the load 12.

For a dependable triggering of the semiconductor elements of the power semiconductor unit 13, triggering in all off the modifications of the circuit in accordance with the invention can be effected at the earliest possible instant without being influenced by the loads 11 and 12 by means of a d.c. coupled zero-point control signal. It is to be noted that the trigger voltage of semiconductor elements is load-dependent, which in the case of short trigger pulses, where applicable via the control, results in the trigger pulses being shifted. A comparatively late, in particular d.c. isolated, triggering then leads to radio interference and requires additional constructional remedies.

It is to be noted also that obviously the switches 15 and 16 may be switchable separately, so that further switching states are possible, but which as a rule is not necessary for heating equipment.

Figure 6:
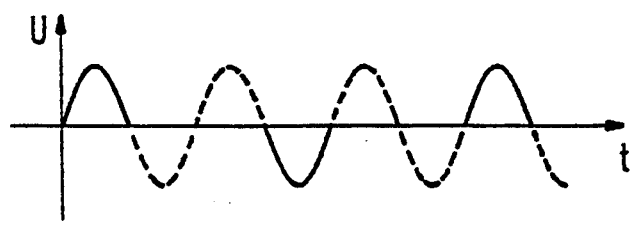
FIG. 6 shows the basic voltage waveform in the $\frac{1}{3}$ phase mode.

FIG. 6 shows the basic voltage waveform U in the ⅓ phase mode plotted along the time axis t. Every active halfcycle, shown in full, is followed by two inactive halfcycles, shown in broken lines. The 1/5 phase mode, not shown, is obtained in a similar way.

Figure 7:
FIG. 7 shows the basic voltage waveform in the pulsed $\frac{1}{3}$ phase mode.

FIG. 7 shows the pulsed voltage waveform U corresponding to the ⅓ phase mode in FIG. 6 but plotted to another scale on the time axis t. By means of, for example, a turn-on pulse width larger than/equal to 300 ms and a turn-off pulse width of some tens of ms to a few seconds, it is possible to power, for example, two halogen lamps with 1000 W each in compliance with the IEC 555 standard mentioned in the introductory part.

Figure 8:
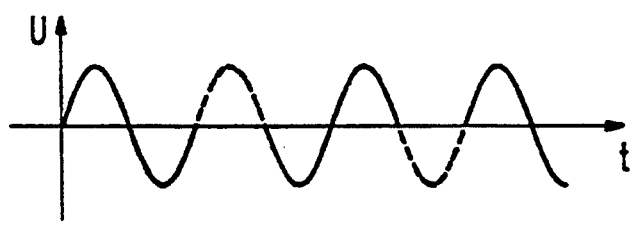
FIG. 8 shows the basic voltage waveform in the $\frac{2}{3}$ phase mode.

FIG. 8, in the same way as FIG. 6, shows the basic voltage waveform U in the ⅔ phase mode plotted on the time axis t. Two active halfcycles, shown in full, are followed by an inactive halfcycle, shown in broken lines.

Figure 9:
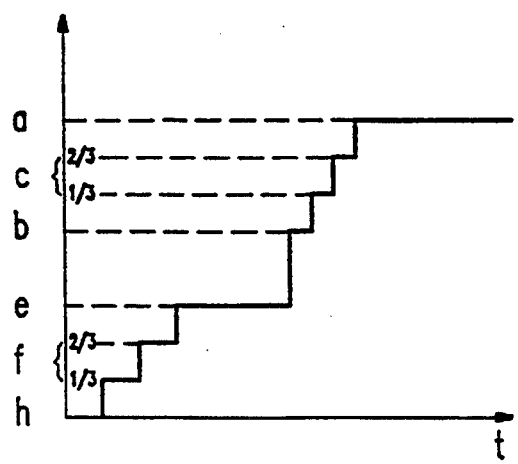
FIG. 9 illustrates diagrammatically a starting/switching operation to maximum power cycle with minimal mains pollution.

FIG. 9 shows the power consumption on the vertical axis as function of the time t for a soft starting/turning-up cycle from zero to the maximum power, which generally gives rise to minimal pollution of the supply voltage.

The switching state h) corresponds to zero power and the switching state a) to the maximum power. The turn-on times for the individual switching states may be 120 ms for the state f), each time for one half in the ⅓ and in the ⅔ phase mode, and 180 ms for the state e). The procedure to reach the switching state a) with, for example, two loads 11 and 12 of 1000 W each may differ for the two modifications of the circuit shown in FIGS. 1 and 2.

In FIG. 1 the relay 14 is switched over within approximately 20 ms and the state b) prevails for another 60 ms during which only the load 12 is connected to the supply voltage. Subsequently, the state c) may be provided for 120 ms with the addition of the load 11 each time for one half in the ⅓ and ⅔ phase mode by means of the semiconductor unit 13.

In FIG. 2 the relay 14 is initially also switched over within approximately 20 ms with the power semiconductor unit 13 turned off. Subsequently, to achieve a soft transition, the two loads 11, 12 are operated in the state j), i.e. the ⅓ phase mode for 30 ms and the ⅔ phase mode for another 30 ms in parallel.

It is possible to omit intermediate stages from the above switching states up to the state a). However, this leads to increased mains pollution.

Further power stages, for example, corresponding to the switching states c) and d) with powers between the maximum power and half the power or corresponding to g) with minimum powers between approximately 5% and 15% of the maximum power through arbitrary selection of the pulse ratio are certainly conceivable as keep-warm stages for heating apparatuses.

Another advantageous starting/turn-up cycle, not shown, is obtained by the succession of switching states f), e) and a). Alternatively, the last-mentioned switching state a) may be replaced by the switching state i) or j).

In comparison with a phase-control method, the starting cycles described herein do not require expensive measures for radio interference suppression and are soft enough to keep mains pollution very small.

The characteristic features of the invention disclosed in the above description, in the Figures and in the Claims may be important both individually and in any arbitrary combination to realise the invention in its different embodiments.

We claim:

1. A circuit for controlling power to at least two loads from a source of AC supply voltage comprising: a bidirectional power semiconductor unit, switching elements, and a control unit for controlling operation of the power semiconductor unit and the switching elements so as to control the power consumption of the loads, characterized in that the control unit is adapted to control the power semiconductor unit and the switching elements so as to connect one or both loads to the power semiconductor unit via the switching elements in at least two power supply modes of operation.

2. A circuit as claimed in claim 1, wherein the power semiconductor unit has a first terminal connected to a reference potential and a second terminal connected to one load and, via at least one of the switching elements, to the other load.

3. A circuit as claimed in claim 2, wherein the power semiconductor unit comprises one triac or two oppositely poled thyristors and the switching elements comprise a single relay having a first and a second change-over switch.

4. A circuit as claimed in claim 3, wherein in a first position of the relay the power semiconductor unit is connected to a phase terminal of the AC supply voltage via the one load, a connecting line, the second change-over switch and the other load, and in a second position of the relay the power semiconductor unit is connected to the phase terminal via the one load and the first change-over switch and the other load is connected in parallel with the power semiconductor unit, the first load and the first change-over switch.

5. A circuit as claimed in claim 3, wherein in a first position of the relay the power semiconductor unit is connected to a phase terminal of the AC supply voltage via the one load, a connecting line, the second change-over switch and the other load, and in a second position of the relay the power semiconductor unit is connected to the phase terminal via the one load and the first change-over switch and the other load is connected in parallel with the first load and the first change-over switch via the second change-over switch and a connection line.

6. A circuit as claimed in claim 3 comprising a single power semiconductor unit, and a thermistor connected in a connection line between an operating contact of the first change-over switch and a rest contact of the second change-over switch in order to limit turn-on transients.

7. A circuit as claimed in claim 1, wherein the switching elements comprise a relay with two change-over switches for coupling the loads in series or in parallel depending on the control unit, and the power semiconductor unit includes first and second parts, one part for each switching direction, the first and second parts being associated with respective ones of the loads, each part of the power semiconductor unit, in the case of parallel operation of the two loads, having one terminal connected to a reference potential and comprising an oppositely poled diode and a thyristor.

8. A circuit as claimed in claim 1, wherein the switching elements comprise a relay with two change-over switches for coupling the loads in series or in parallel depending on the control unit, and the power semiconductor unit has a first terminal connected to a phase terminal of the AC supply voltage and comprises one triac or two oppositely poled thyristors.

9. A circuit as claimed in claims 1, 2 or 3 wherein the control unit comprises a logic device in the form of a microprocessor and, for a quasi reaction-free control of the power consumption of the loads, is adapted to control one or more of the following switching states:
   a) parallel operation of the two loads to the supply voltage,
   b) operation of only one load with the supply voltage,
   c) operation of the one load with the supply voltage and operation of the other load in a ⅔, ⅓ or 1/5 phase mode,
   d) operation as under c) with pulsed phases,
   e) series operation of the two loads to the supply voltage,
   f) operation of the two loads in series in the ⅔, ⅓ or 1/5 phase mode,
   g) operation as under f) with pulsed phases,
   h) operation with both loads "off",
   i) operation of the one load with the supply voltage and delayed connection of the other load with operation thereof in the ⅓ and ⅔ phase mode, and
   j) operation of both loads in the ⅔ or ⅓ phase mode.

10. A circuit as claimed in claim 9, wherein, in a starting/turn-on cycle, the control unit causes the switching states f), e) and a), i) or j) to be traversed successively to attain the maximum power, and at least one of the switching states b) to j) is traversed to reduce the power consumption.

11. A circuit for controlling the supply of power to at least first and second loads from a source of AC supply voltage comprising:
   first and second input terminals for connection to the source of AC supply voltage,
   a bi-directional controlled semiconductor switching unit,
   switching means having first and second change-over switches, wherein the switching means and the controlled semiconductor switching unit each have a control input for receiving control signals that selectively operate the switching means and the controlled semiconductor switching unit so as to connect one or both of the loads to the controlled semiconductor switching unit via the change-over switches of the switching means thereby to produce a plurality of power operating states for the first and second loads.

12. A power supply circuit as claimed in claim 11 wherein the controlled semiconductor switching unit has a first main terminal connected to a point of reference potential and a second main terminal connected to the first load and via one of the change-over switches to the second load.

13. A power supply circuit as claimed in claims 11 or 12 wherein said control signals are operative to control the switching means and the controlled semiconductor switching unit so as to selectively produce one or more of the following power operating states:
  a) connection of the first and second loads in parallel to the first and second input terminals,
  b) connection of only one load to the first and second input terminals,
  c) connection of one load to the first and second input terminals and operation of the controlled semiconductor switching unit so as to supply power to the other load from the first and second input terminals in a $\frac{2}{3}$, a $\frac{1}{3}$ or 1/5 phase mode,
  d) operation as in state c) above but with pulsed voltages for the other load,
  e) connection of the first and second loads in series to the first and second input terminals,
  f) connection of the first and second loads in series to the first and second input terminals and operation of the controlled semiconductor switching unit so as to supply power to the first and second loads from the first and second input terminals in a $\frac{2}{3}$, a $\frac{1}{3}$ or a 1/5 phase mode,
  g) operation as in state f) above but with pulsed voltages for the first and second loads,
  h) disconnection of both loads from the first and second input terminals,
  i) connection of one load to the first and second input terminals and a delayed connection of the other load to the first and second input terminals via operation of the controlled semiconductor switching unit,
  j) connection of both loads to the first and second input terminals and operation thereof via the controlled semiconductor switching unit in the $\frac{2}{3}$ or $\frac{1}{3}$ phase mode.

14. A power supply circuit as claimed in claims 11 or 12 wherein a start-up/turn-on cycle comprises:
  connection of the first and second loads in series to the first and second input terminals and operation of the controlled semiconductor switching unit so as to supply power to the first and second loads from the first and second input terminals in a $\frac{2}{3}$, $\frac{1}{3}$ or a 1/5 phase mode, and then
  connection of the first and second loads in series to the first and second input terminals, and then
  connection of the first and second loads in parallel to the first and second input terminals.

15. A power supply circuit as claimed in claims 11 or 12 wherein a start-up/turn-on cycle comprises:
  connection of one load to the first and second input terminals and a delayed connection of the other load to the first and second input terminals via operation of the controlled semiconductor switching unit, and then
  connection of both loads to the first and second input terminals and operation thereof via the controlled semiconductor switching unit in the $\frac{2}{3}$ or $\frac{1}{3}$ phase mode.

16. A power supply circuit as claimed in claim 14 wherein at least one of the power operating states b) to j) in claim 13 is included in the start-up/turn-on cycle.

17. A power supply circuit as claimed in claim 15 wherein at least one of the power operating states b) to j) in claim 13 is included in the start-up/turn-on cycle.

18. A power supply circuit as claimed in claim 11 wherein the switching means is controlled into a first state in which the controlled semiconductor switching unit, the second load and the second change-over switch are connected in series to the first and second input terminals, and in a second state of the switching means, the controlled semiconductor switching unit is connected in series with the first load and the first change-over switch to the first and second input terminals and the second load is connected to the first and second input terminals via the second change-over switch.

19. A power supply circuit as claimed in claim 11 wherein the switching means is controlled into a first state in which the controlled semiconductor switching unit, the first load, the second change-over switch and the second load are connected in series to the first and second input terminals, and in a second state of the switching means, the controlled semiconductor switching unit is connected in series with the first load and the first change-over switch to the first and second input terminals and the second load is connected to the first and second input terminals via the second change-over switch and the controlled semiconductor switching unit.

* * * * *